United States Patent
Yang et al.

(10) Patent No.: US 10,209,585 B2
(45) Date of Patent: Feb. 19, 2019

(54) DISPLAY PANEL AND METHOD OF MANUFACTURING THE SAME

(71) Applicant: Samsung Display Co., Ltd., Yongin-Si, Gyeonggi-Do (KR)

(72) Inventors: Dong-Ju Yang, Seoul (KR); Seungjin Kim, Asan-si (KR); Beomsoo Park, Hwaseong-si (KR); Hyungchul Kim, Cheonan-si (KR); Eunhye Park, Asan-si (KR); Jeongeum Lee, Cheonan-si (KR); Junki Lee, Hwaseong-si (KR); Jiyun Hong, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/595,111

(22) Filed: May 15, 2017

(65) Prior Publication Data
US 2018/0031891 A1 Feb. 1, 2018

(30) Foreign Application Priority Data
Aug. 1, 2016 (KR) .................. 10-2016-0098152

(51) Int. Cl.
*H01L 29/12* (2006.01)
*G02F 1/1343* (2006.01)
(Continued)

(52) U.S. Cl.
CPC .......... *G02F 1/13439* (2013.01); *G02F 1/137* (2013.01); *G02F 1/1368* (2013.01); *G02F 1/133345* (2013.01); *G02F 1/133512* (2013.01); *G02F 1/133514* (2013.01); *G02F 1/134309* (2013.01); *G02F 1/136209* (2013.01); *G02F 1/136227* (2013.01); *G02F 1/136286* (2013.01); *H01L 27/124* (2013.01);
(Continued)

(58) Field of Classification Search
CPC ........... H01L 21/02381; H01L 29/4908; H01L 29/517; H01L 29/66969; H01L 29/78693
USPC .......................................................... 257/43
See application file for complete search history.

(56) References Cited

U.S. PATENT DOCUMENTS

| | | | |
|---|---|---|---|
| 2009/0039350 A1* | 2/2009 | Oh | H01L 27/12 257/59 |
| 2009/0068773 A1* | 3/2009 | Lai | H01L 27/1225 438/23 |
| 2009/0224257 A1* | 9/2009 | Chin | H01L 29/458 257/72 |

FOREIGN PATENT DOCUMENTS

| KR | 100943469 B1 | 2/2010 |
|---|---|---|
| KR | 1020130075528 A | 7/2013 |
| KR | 1020140120179 A | 10/2014 |

* cited by examiner

*Primary Examiner* — Theresa T Doan
(74) *Attorney, Agent, or Firm* — Cantor Colburn LLP

(57) ABSTRACT

A display panel includes a first base substrate, a gate line disposed on the first base substrate and extending in a first direction, a gate electrode electrically connected to the gate line, a thin film transistor including an active pattern which includes a source area, a drain area and a channel area overlapping the gate electrode, a common electrode disposed on the first base substrate, where a common voltage is applied to the common electrode, an auxiliary common electrode line electrically connected to the common electrode, and including an opaque metal, a pixel electrode electrically connected to the thin film transistor, and disposed on the common electrode to overlap the common (Continued)

electrode, and a cover electrode connected to the auxiliary common electrode line, and overlapping the channel area.

14 Claims, 17 Drawing Sheets

(51) Int. Cl.
    *G02F 1/1333*     (2006.01)
    *G02F 1/1335*     (2006.01)
    *G02F 1/1362*     (2006.01)
    *G02F 1/1368*     (2006.01)
    *G02F 1/137*     (2006.01)
    *H01L 27/12*     (2006.01)
    *H01L 29/786*     (2006.01)

(52) U.S. Cl.
    CPC ........ *H01L 27/127* (2013.01); *H01L 27/1222* (2013.01); *H01L 27/1225* (2013.01); *H01L 29/78633* (2013.01); *H01L 29/78669* (2013.01); *H01L 29/78693* (2013.01); *G02F 2001/134372* (2013.01); *G02F 2001/136295* (2013.01); *G02F 2201/121* (2013.01); *G02F 2201/123* (2013.01)

US 10,209,585 B2

DISPLAY PANEL AND METHOD OF MANUFACTURING THE SAME

This application claims priority to Korean Patent Application No. 10-2016-0098152, filed on Aug. 1, 2016, and all the benefits accruing therefrom under 35 U.S.C. § 119, the content of which in its entirety is herein incorporated by reference.

BACKGROUND

1. Field

Exemplary embodiments of the invention relate to a display panel and a method of manufacturing the display panel. More particularly, exemplary embodiments of the invention relate to a display panel for a liquid crystal display apparatus and a method of manufacturing the display panel.

2. Description of the Related Art

Recently, a display apparatus having a light weight and a small size has been manufactured. A cathode ray tube ("CRT") display apparatus has been used due to advantages such as a performance and a competitive price. However, the CRT display apparatus has a disadvantage in size or portability. Therefore, a display apparatus such as a plasma display apparatus, a liquid crystal display ("LCD") apparatus and an organic light emitting display apparatus has been highly regarded due to various advantages such as a small size, light weight and low-power-consumption.

The LCD apparatus applies a voltage to a specific molecular arrangement configured to change the molecular arrangement. The LCD apparatus displays an image using changes of optical property (e.g., birefringence, rotatory polarization, dichroism and light scattering) of a liquid crystal cell according to the changes of the molecular arrangement.

SUMMARY

When undesired light is incident on a channel region of a thin film transistor ("TFT") due to elements of a liquid crystal display ("LCD") apparatus, characteristics of the TFT are deteriorated, so that display quality of the LCD apparatus may be deteriorated.

One or more exemplary embodiments of the invention provide a display panel which improves display quality.

One or more exemplary embodiments of the invention also provide a method of manufacturing the display panel.

According to an exemplary embodiment of the invention, a display panel includes a first base substrate, a gate line disposed on the first base substrate and extending in a first direction, a gate electrode electrically connected to the gate line, a TFT including an active pattern which includes a source area, a drain area and a channel area overlapping the gate electrode, a common electrode disposed on the first base substrate, where a common voltage is applied to the common electrode, an auxiliary common electrode line electrically connected to the common electrode, and including an opaque metal, a pixel electrode electrically connected to the TFT, and disposed on the common electrode to overlap the common electrode, and a cover electrode connected to the auxiliary common electrode line, and overlapping the channel area.

In an exemplary embodiment, the common electrode may include transparent conductive material. The auxiliary common electrode line may be in a same layer as the auxiliary common electrode line, and may include a same material as that of the auxiliary common electrode line.

In an exemplary embodiment, the auxiliary common electrode line may extend in the first direction, and overlaps the gate line.

In an exemplary embodiment, entire of the channel area may be covered by the cover electrode.

In an exemplary embodiment, the gate electrode may be overlapped with entire of the cover electrode.

In an exemplary embodiment, the auxiliary common electrode line and the cover electrode directly may make contact with the common electrode.

In an exemplary embodiment, the display panel may further include a first insulation layer disposed between the gate electrode and the active pattern, a second insulation layer disposed between the active pattern and the common electrode, and a third insulation layer disposed between the common electrode and the pixel electrode.

In an exemplary embodiment, the auxiliary common electrode line and the cover electrode may be disposed between the common electrode and the third insulation layer.

In an exemplary embodiment, the auxiliary common electrode line and the cover electrode may be disposed between the common electrode and the second insulation layer.

In an exemplary embodiment, a common electrode hole may be defined through the common electrode. In a plan view, a contact hole defined through the first and second insulation layers is defined in the common electrode hole. The pixel electrode may be connected to the TFT through the contact hole.

In an exemplary embodiment, a plurality of slit-shaped openings may be defined at the pixel electrode.

In an exemplary embodiment, the display panel may further include a second base substrate facing the first base substrate, and a black matrix disposed on the second base substrate, overlapping the TFT, the auxiliary common electrode line and the cover electrode.

In an exemplary embodiment, the display panel may further include a color filter disposed between the first base substrate and the common electrode.

In an exemplary embodiment, a common voltage may be applied to the common electrode, the auxiliary common electrode line and the cover electrode.

According to an exemplary embodiment of the invention, a method of manufacturing a display panel includes forming a TFT including an active pattern which includes a channel area, a source area and a drain area on a first base substrate, forming a common electrode on the first base substrate on which the TFT is disposed, forming an auxiliary common electrode line and a cover electrode, where the auxiliary common electrode line is electrically connected to the common electrode and includes an opaque metal, where the cover electrode is connected to the auxiliary common electrode line and overlaps the channel area of the active pattern, and the cover electrode includes a same material as that of the auxiliary common electrode line, and forming a pixel electrode electrically connected to the TFT.

In an exemplary embodiment, the method may further include forming a gate electrode on the first base substrate, forming a first insulation layer on the gate electrode, forming a second insulation layer on the TFT, and forming a third insulation layer on the common electrode, the auxiliary common electrode line and the cover electrode. The common electrode may be disposed between the second insulation layer and the third insulation layer. The third insulation layer may be disposed between the common electrode and the pixel electrode.

In an exemplary embodiment, the method may further include defining a contact hole which exposes the TFT through the second and third insulation layers. A common electrode hole may be defined through the common electrode. In a plan view, a contact hole defined through the first and second insulation layers may be defined in the common electrode hole. The pixel electrode may be connected to the TFT through the contact hole.

In an exemplary embodiment, entire of the channel area may be covered by the cover electrode. The gate electrode may be overlapped with entire of the cover electrode.

In an exemplary embodiment, the auxiliary common electrode line and the cover electrode may be provided before the common electrode is provided.

In an exemplary embodiment, the method may further include forming a color filter on the first base substrate after forming the TFT and before forming the common electrode.

According to the invention, a display panel includes a gate electrode, a TFT including an active pattern having a channel area overlapping the gate electrode, a common electrode, an auxiliary common electrode line electrically connected to the common electrode and including an opaque metal, a pixel electrode electrically connected to the TFT and overlapping the common electrode, and a cover electrode connected to the auxiliary common electrode line and overlapping the channel area. The cover electrode includes opaque metal, and covers the channel area, so that it is possible to prevent light from being reflected by an internal structure of the display panel and incident into the channel area. Accordingly, electrical characteristics of the TFT can be prevented from being degraded, and display quality of a display apparatus including the display panel can be improved.

In addition, the cover electrode and the auxiliary common electrode line may be disposed in a same layer, so that an additional process for forming the cover electrode is not desired.

It is to be understood that both the foregoing general description and the following detailed description are exemplary and explanatory and are intended to provide further explanation of the invention as claimed

BRIEF DESCRIPTION OF THE DRAWINGS

The above and other features of the invention will become more apparent by describing in detail exemplary embodiments thereof with reference to the accompanying drawings, in which.

DETAILED DESCRIPTION

Figure 1:
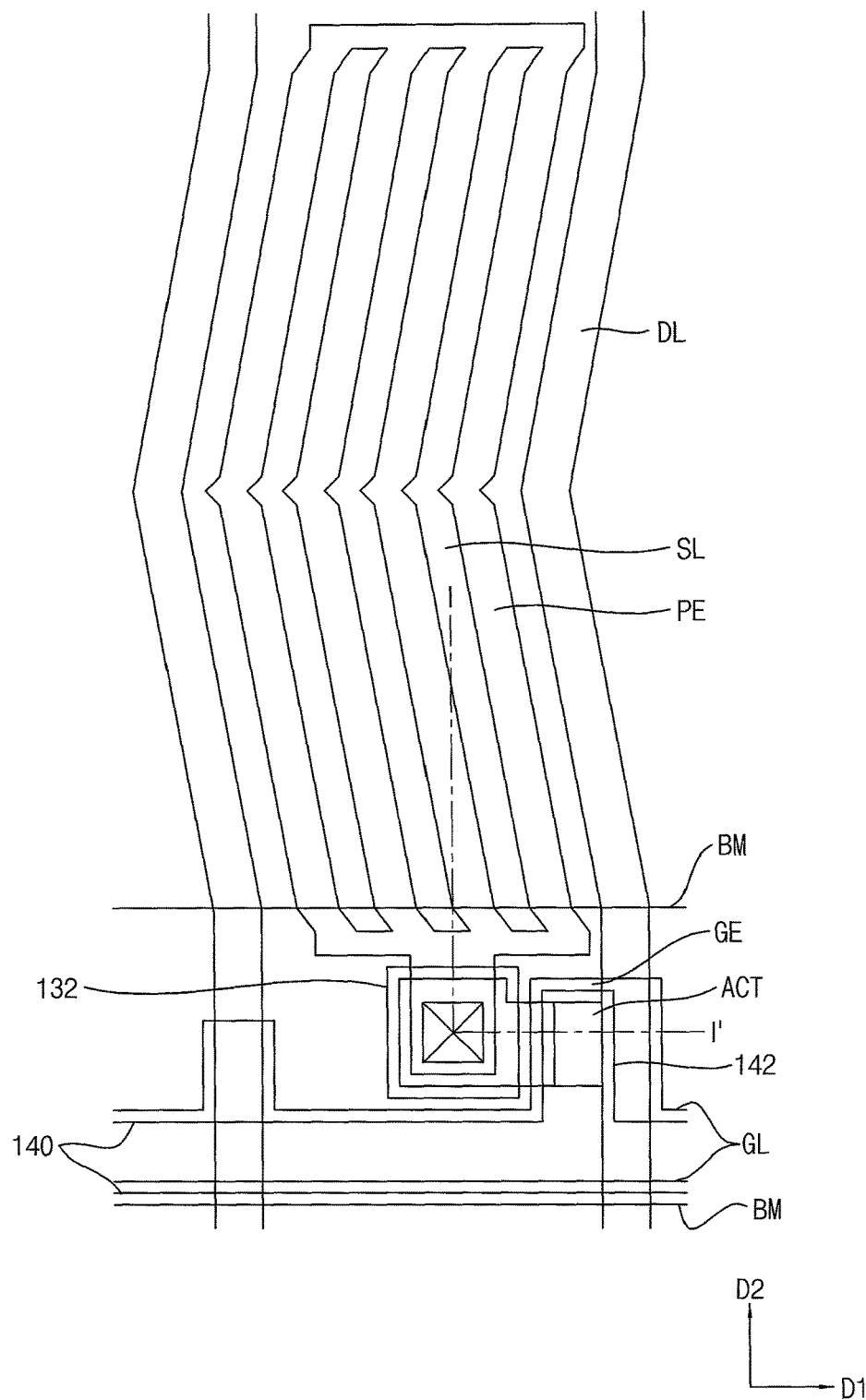
FIG. 1 is a plan view illustrating an exemplary embodiment of a display panel according to the invention.

Hereinafter, the invention will be explained in detail with reference to the accompanying drawings. This invention may, however, be embodied in many different forms, and should not be construed as limited to the embodiments set forth herein. Rather, these embodiments are provided so that this invention will be thorough and complete, and will fully convey the scope of the invention to those skilled in the art. Like reference numerals refer to like elements throughout.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an exemplary embodiment, when the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, when the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. In an exemplary embodiment, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Figure 2:
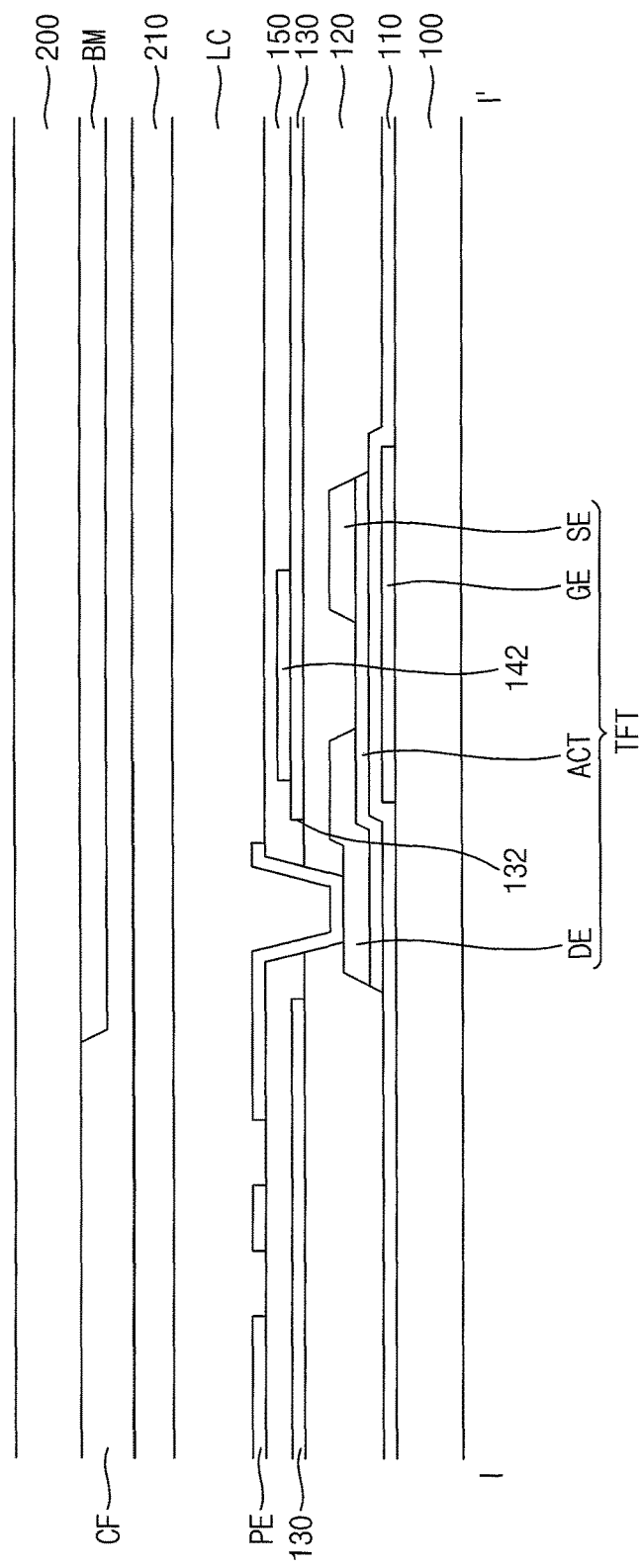
FIG. 2 is a cross-sectional view taken along line I-I' of FIG. 1.

FIG. 1 is a plan view illustrating a display panel according to an exemplary embodiment of the invention. FIG. 2 is a cross-sectional view taken along line I-I' of FIG. 1. The display panel may include a plurality of pixels arranged in a matrix form. A structure corresponding to one pixel of the display panel is shown in the figure.

Referring to FIGS. 1 and 2, the display panel may include a TFT substrate, an opposite substrate facing the TFT substrate and a liquid crystal layer LC between the TFT substrate and the opposite substrate.

The TFT substrate may include a first base substrate 100, a gate pattern, a first insulation layer 110, an active pattern ACT, a data pattern, a second insulation layer 120, a common electrode 130, a metal pattern, a third insulation layer 150 and a pixel electrode PE.

The first base substrate 100 may include a material having excellent light transmittance, heat resistance, and chemical resistance. In an exemplary embodiment, the base substrate 100 may include a glass substrate, a quartz substrate, a transparent resin substrate, etc., for example. Examples of the transparent resin substrate for the base substrate 100 may include polyimide-based resin, acryl-based resin, polyacrylate-based resin, polycarbonate-based resin, polyether-based resin, sulfonic acid including resin, polyethyleneterephthalate-based resin, etc.

The gate pattern may be disposed on the first base substrate 100. In an exemplary embodiment, the gate pattern may include metal, alloy, conductive metal oxide, a transparent conductive material, etc., for example. The gate pattern may include a gate line GL and a gate electrode GE.

The gate line may extend in a first direction D1. The gate line GL may receive a gate signal to drive the display panel.

The gate electrode GE may electrically connected to the gate line GL, and may be protruded from the gate line GL in a second direction D2 which crosses the first direction D1.

The first insulating layer 110 may be disposed on the first base substrate 100 on which the gate pattern is disposed. In an exemplary embodiment, the first insulating layer 110 may include a silicon compound, metal oxide, etc., for example. In an exemplary embodiment, the first insulation layer 110 may be provided using silicon oxide (SiOx), silicon nitride (SiNx), silicon oxynitride (SiOxNy), aluminum oxide (AlOx), tantalum oxide (TaOx), hafnium oxide (HfOx), zirconium oxide (ZrOx), titanium oxide (TiOx), etc., for example. These may be used alone or in a combination thereof. In exemplary embodiments, the first insulation layer 110 may be uniformly disposed on the first base substrate 100 along a profile of the gate pattern. Here, the first insulation layer 110 may have a substantially small thickness, such that a stepped portion may be provided at a portion of the first insulation layer 110 adjacent to the gate pattern. In exemplary embodiments, the first insulation layer 110 may have a relatively large thickness for sufficiently covering the gate pattern, so that the first insulation layer 110 may have a substantially level surface.

The active pattern ACT may be disposed on the first insulation layer 110 and overlap the gate electrode GE. The active pattern ACT may include source and drain areas which is impurity-doped area, and a channel area between the source area and the drain area. The gate electrode GE may be provided to be sufficiently large so as to overlap not only the channel area of the active pattern ACT but also a portion of the source and drain areas.

The data pattern may be disposed on the active pattern ACT. The data pattern may include a data line DL, a source electrode SE in contact with the source area, and a drain electrode DE in contact with the drain area. In an exemplary embodiment, the data pattern may be provided using a metal, an alloy, a metal nitride, a conductive metal oxide, a transparent conductive material, or the like.

The data line DL may extend in the second direction D2 which crosses the first direction D1. The second direction D2 may be substantially perpendicular to the first direction D1. The data line DL may extend in a direction inclined at a predetermined angle with respect to the second direction D2, or may be bent in the shape of '<' or '>' as shown in the drawings.

The second insulation layer 120 may be disposed on the first insulation layer 110 on which the active pattern ACT and the data pattern are disposed. The second insulation layer 120 may be provided using an organic material. In an exemplary embodiment, the second insulation layer 120 may include a photoresist, an acrylic resin, a polyimide resin, a polyamide resin, a siloxane-based resin, or the like. These may be used alone or in combination with each other, for example. In exemplary embodiments, the second insulation layer 120 may be provided using an inorganic material such as a silicon compound, metal, metal oxide, or the like, for example.

The second insulation layer 120 may have a relatively large thickness for sufficiently covering the active pattern ACT and the data pattern, so that the second insulation layer 120 may have a substantially level surface. In exemplary embodiments, the second insulation layer 120 may be uniformly disposed on the first insulation layer 110 along a profile of the active pattern ACT and the data pattern.

The common electrode 130 may be disposed on the second insulation layer 120. The common electrode 130 may include transparent conductive material. In an exemplary embodiment, the common electrode 130 may be provided using the transparent conductive material such as indium tin oxide ("ITO"), indium zinc oxide ("IZO") or the like.

A common electrode hole 132 may be defined through the common electrode 130. The common electrode hole 132 may overlap the drain electrode DE. A common voltage may be applied to the common electrode 130.

The metal pattern may be disposed on the common electrode 130. The metal pattern may include a low resistance opaque metal. In an exemplary embodiment, the metal pattern may include aluminum (Al), titanium (Ti), gold (Au), chromium (Cr), silver (Ag), copper (Cu), nickel (Ni), iron (Fe), cobalt (Co) or the like, for example. The metal pattern may include an auxiliary common electrode line 140 and a cover electrode 142.

The auxiliary common electrode line 140 may extend in the first direction D1. The auxiliary common electrode line 140 may overlap the gate line GL. The auxiliary common electrode line 140 may directly contact the common electrode 130 and include a low resistance opaque metal unlike the common electrode 130 including a transparent conductive material, so that the common voltage can be stably maintained.

The cover electrode 142 may be protruded from the auxiliary common electrode line 140 in the second direction D2. The cover electrode 142 may overlap the channel area of the active pattern ACT. Preferably, the cover electrode 142 may completely cover the channel area. Since the cover electrode 142 includes the opaque metal and covers the channel area, it is possible to prevent light from being reflected by an internal structure of the display panel and incident into the channel area. Accordingly, electrical characteristics of the thin film transistor TFT are prevented from being degraded, and display quality of the display apparatus including the display panel is improved.

The third insulating layer 150 may be disposed on the metal pattern, the common electrode 130, and the second insulation layer 120. In an exemplary embodiment, the third insulating layer 150 may be provided using silicon oxide, a metal oxide, or the like, for example. In exemplary embodiments, the third insulating layer 150 may be provided using an organic material.

In exemplary embodiments, the third insulation layer 150 may be uniformly disposed on the second insulation layer 120 along a profile of the metal pattern and the common electrode 130. In this case, the third insulation layer 150 may have a relatively thin thickness. In exemplary embodiment, the third insulation layer 150 may have a relatively large thickness for sufficiently covering the metal pattern and the common electrode 130, so that the third insulation layer 150 may have a substantially level surface.

The pixel electrode PE may be disposed on the third insulation layer 150. The pixel electrode PE may be electrically connected to the drain electrode DE of the thin film transistor TFT through the second insulation layer 120 and a contact hole defined through the third insulation layer 150. In the illustrated exemplary embodiment, the contact hole is defined as a sing hole through the second insulation layer 120 and the third insulation layer 150. However, in other exemplary embodiments, a first contact hole may be defined through the second insulation layer 120, and a second contact hole smaller than the first contact hole may be defined through the third insulation layer 150, so that the pixel electrode PE may be electrically connected to the drain electrode DE through the first and second contact holes. A plurality of slit-shaped openings SL may be defined in the pixel electrode PE.

The pixel electrode PE may include transparent conductive material. In an exemplary embodiment, the pixel electrode PE may be provided using the transparent conductive material such as ITO IZO or the like, for example.

The opposite substrate may include a second base substrate 200, a black matrix BM, a color filter CF, and an over-coating layer 210.

The second base substrate 200 may include a material having excellent light transmittance, heat resistance, and chemical resistance. In an exemplary embodiment, the second base substrate 200 may include a glass substrate, a quartz substrate, a transparent resin substrate, etc., for example. Examples of the transparent resin substrate for the second base substrate 200 may include polyimide-based resin, acryl-based resin, polyacrylate-based resin, polycarbonate-based resin, polyether-based resin, sulfonic acid including resin, polyethyleneterephthalate-based resin, etc.

The black matrix BM may be disposed on the second base substrate 200. The black matrix BM may be arranged corresponding to an area outside of a pixel area in which an image is displayed, and may block light. The black matrix BM may extend in the first direction D1. The black matrix BM may be disposed to overlap the gate line GL, the auxiliary common electrode line 140, the cover electrode 142, and the thin film transistor TFT.

The color filter CF may be disposed on the second base substrate 200 on which the black matrix BM is disposed. The color filter CF may provide color to light transmitted through the liquid crystal layer LC. In an exemplary embodiment, the color filter CF may be a red color filter representing a red color, a green color filter representing a green color, and a blue color filter representing a blue color. However, the invention is not limited thereto, and the color filter CF may represent various other colors. The color filters CF may be provided corresponding to each of the pixels and may be arranged to have different colors between adjacent pixels. The color filters CF may be partially overlapped by adjacent color filters CF at boundaries of adjacent pixel, or the color filters CF may be spaced from the boundaries of adjacent pixels.

The over-coating layer 210 may be disposed on the black matrix BM. In an exemplary embodiment, the over-coating layer 210 may protect and planarize the black matrix BM and the color filter CF and may be provided using an acrylic epoxy material, for example.

The liquid crystal layer LC may be disposed between the TFT substrate and the opposite substrate. The liquid crystal layer LC may include liquid crystal molecules having optical anisotropy. The liquid crystal molecules may be driven by an electric field to transmit or block light passing through the liquid crystal layer LC to display an image.

In addition, the display apparatus including the display panel may further include a backlight assembly (not shown) positioned on a back surface of the TFT substrate. Light generated from the backlight assembly may be reflected on the second base substrate 200, the black matrix BM, the color filter CF, the over-coating layer 210, etc., and may proceed to the channel area of the active pattern ACT. Here, the cover electrode 142 can prevent the reflected light from entering the channel area. Accordingly, electrical characteristics of the thin film transistor TFT can be prevented from being degraded, and display quality of the display apparatus can be improved.

In addition, the gate electrode GE may be provided to be sufficiently large so as to overlap not only the channel area of the active pattern ACT but also a portion of the source area and the drain area. Thus, it is possible to prevent the light generated from the backlight assembly from directly entering the channel area. Accordingly, the electrical characteristics of the thin film transistor TFT can be prevented from being degraded, and the display quality of the display apparatus can be improved.

Figure 3:
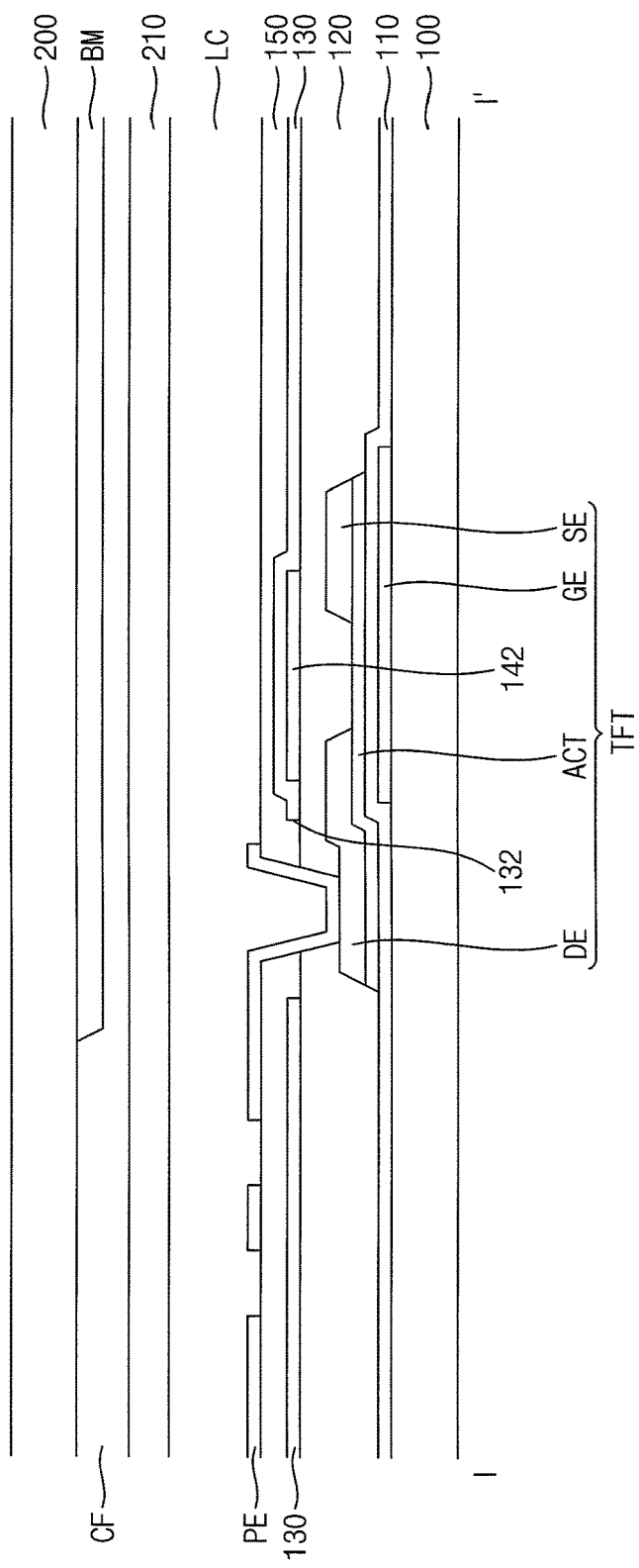
FIG. 3 is a cross-sectional view illustrating another exemplary embodiment of a display panel according to the invention.

FIG. 3 is a cross-sectional view illustrating a display panel according to another exemplary embodiment of the invention.

Referring to FIG. 3, the display panel may be substantially the same as the display panel of FIGS. 1 and 2 except for a position of an auxiliary common electrode line and a cover electrode. Thus, any further detailed descriptions concerning the same elements will be omitted.

A metal pattern may be disposed on a second insulation layer 120. The metal pattern may include a low resistance opaque metal. The metal pattern may include the auxiliary common electrode line 140 (refer to FIG. 1) and the cover electrode 142.

A common electrode 130 may be disposed on the second insulation layer 120 on which the metal pattern is disposed. The common electrode 130 may include a transparent conductive material. A common electrode hole 132 may be defined through the common electrode 130. The common electrode 130 may be disposed on and directly contact the metal pattern.

Figure 4:
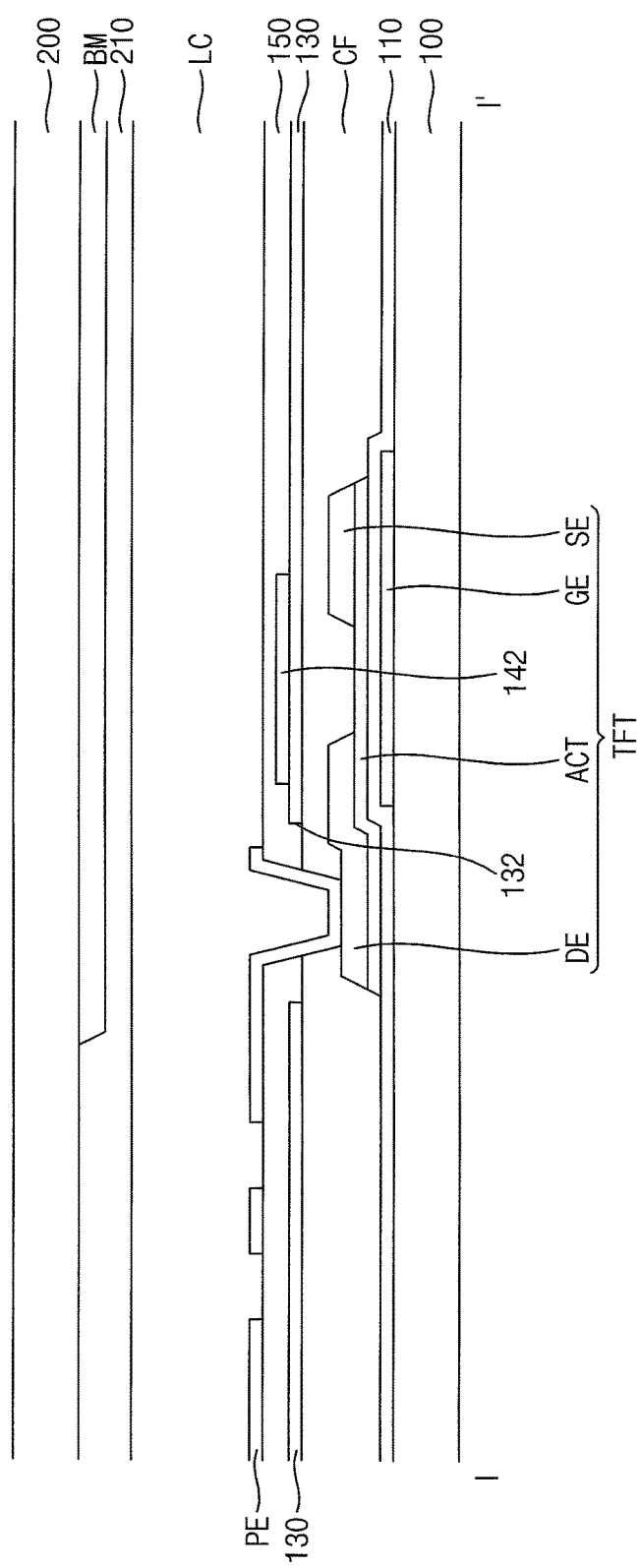
FIG. 4 is a cross-sectional view illustrating another exemplary embodiment of a display panel according to the invention.

FIG. 4 is a cross-sectional view illustrating a display panel according to another exemplary embodiment of the invention.

Referring to FIG. 4, the display panel may be substantially the same as the display panel of FIGS. 1 and 2 except for a position of a color filter. Thus, any further detailed descriptions concerning the same elements will be omitted.

The color filter CF may be disposed on the first insulation layer 110 on which a thin film transistor TFT is disposed. The color filter CF may provide color to light transmitted through a liquid crystal layer LC. In an exemplary embodiment, the color filter CF may be a red color filter representing a red color, a green color filter representing a green color, and a blue color filter representing a blue color, for example. The color filters CF may be provided corresponding to each of pixels and may be arranged to have different colors between adjacent pixels. The color filters CF may be partially overlapped by adjacent color filters CF at boundaries of adjacent pixel, or the color filters CF may be spaced from the boundaries of adjacent pixels.

The common electrode 130 may be disposed on the color filter CF. A metal pattern including an auxiliary common electrode line 140 (refer to FIG. 1) and a cover electrode 142 may be disposed on the common electrode 130. A third insulating layer 150 may be disposed on the metal pattern and the common electrode 130. A pixel electrode PE may be electrically connected to a drain electrode DE of the thin film transistor TFT through a contact hole defined through the third insulating layer 150 and the color filter CF.

A black matrix BM may be disposed on a second base substrate 200 of an opposite substrate. An over-coating layer 210 may be disposed on the second base substrate 200 on which the black matrix BM is disposed.

FIGS. 5A, 5B, 6A, 6B, 7A, 7B, 8A and 8B are plan views and cross-sectional views illustrating a method of manufacturing the display panel of FIGS. 1 and 2.

Figure 5A:
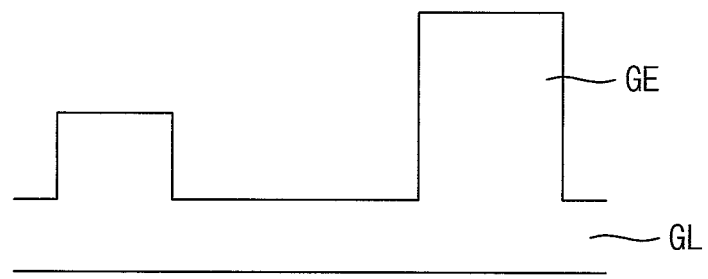
FIGS. 5A, 5B, 6A, 6B, 7A, 7B, 8A and 8B are plan views and cross-sectional views illustrating a method of manufacturing the display panel of FIGS. 1 and 2.
Figure 5A:
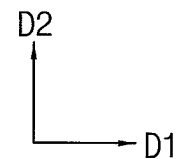
Figure 5B:
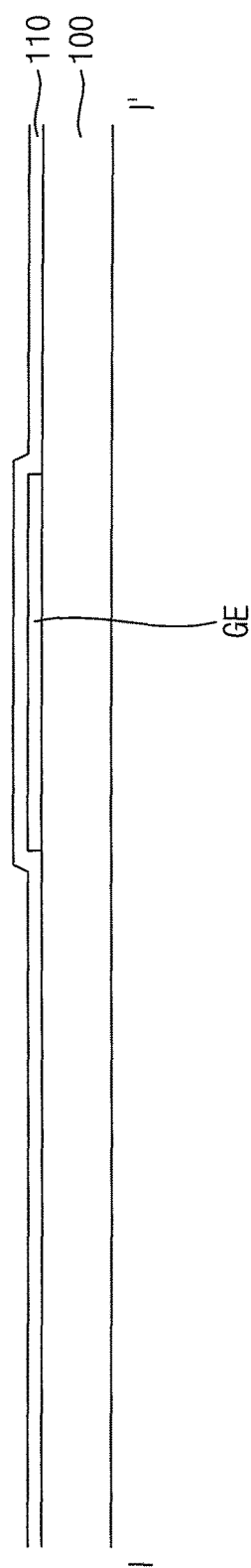

Referring to FIGS. 5A and 5B, a gate pattern may be provided on a first base substrate 100. A conductive layer (not shown) may be disposed on the first base substrate 100, and then the conductive layer may be partially etched by a photolithography process or an etching process using an additional mask, and the gate pattern may be obtained. In an exemplary embodiment, the conductive layer may be provided by a printing process, a sputtering process, a chemical vapor deposition process, an atomic layer deposition process, a vacuum evaporation process, a pulsed laser deposition process, and etc., for example. The gate pattern may include a gate line GL and a gate electrode GE.

Then, a first insulation layer 110 may be disposed on the first base substrate 100 on which the gate pattern is disposed. In an exemplary embodiment, the first insulation layer 110 may be provided by a spin coating process, a chemical vapor deposition process, a plasma enhanced chemical vapor deposition process, a high density plasma-chemical vapor deposition process, and etc., for example.

Figure 6A:
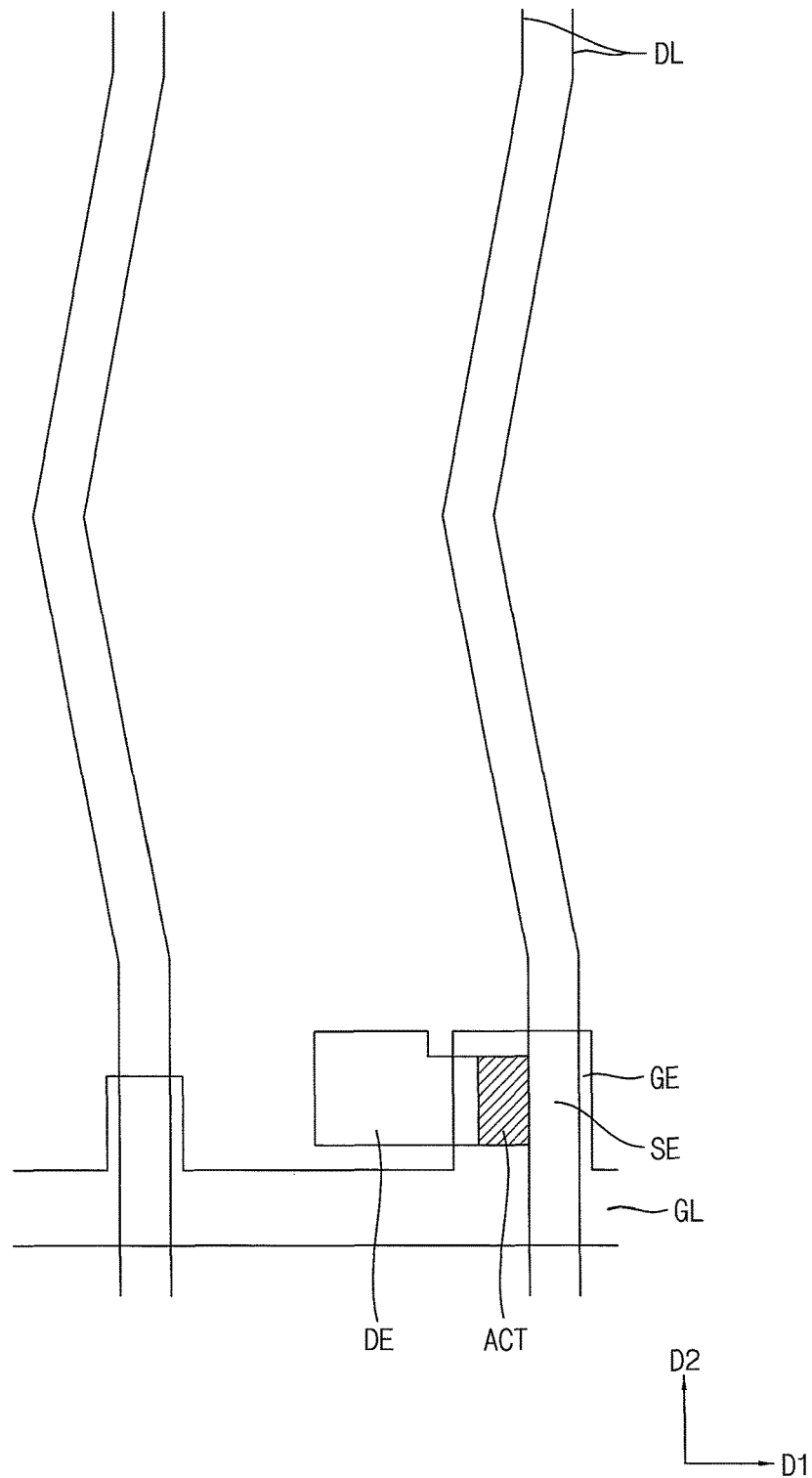
Figure 6B:
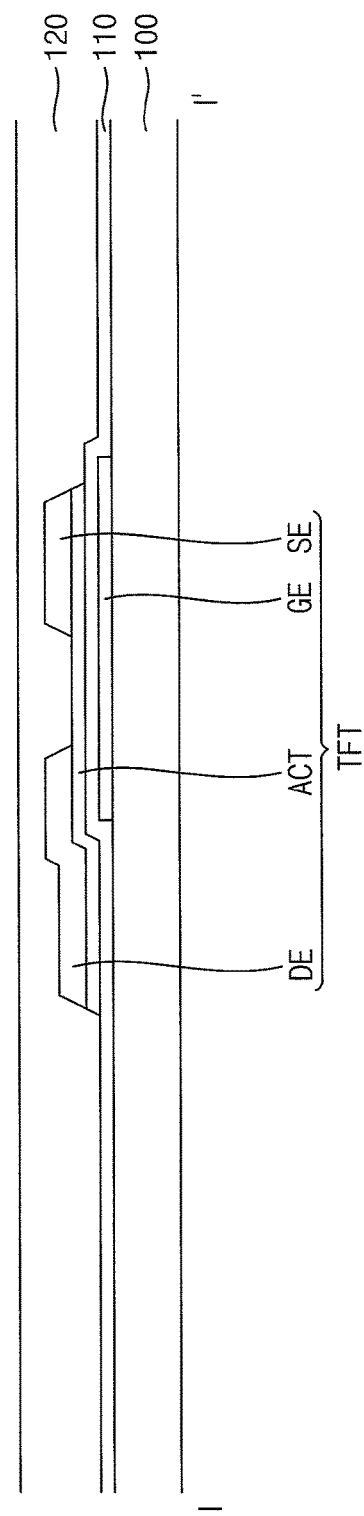

Referring to FIGS. 6A and 6B, an active pattern ACT and a data pattern may be disposed on the first insulation layer 110. In an exemplary embodiment, the data pattern and the active pattern may be disposed on the first insulation layer 110 by an etch-back process or the like, for example. In an exemplary embodiment, an active layer (not shown) may be disposed on the first insulation layer 110, and then a conductive layer may be disposed on the active layer. Then, the conductive layer and the active layer may be simultaneously patterned to provide the active pattern and the data pattern.

In an exemplary embodiment, the active layer may include a semiconductor layer including amorphous silicon (a-Si:H) and an ohmic contact layer including n+ amorphous silicon (n+ a-Si:H), for example. Thus, the ohmic contact layer may be provided between the active pattern and the data pattern. In addition, the active pattern may include an oxide semiconductor. In an exemplary embodiment, the oxide semiconductor may include an amorphous oxide including at least one of indium (In), zinc (Zn), gallium (Ga), tin (Sn) and hafnium (Hf), for example.

The data pattern may include a data line DL, a source electrode SE and a drain electrode DE.

Then, a second insulation layer 120 may be disposed on the first insulation layer 110 on which the active pattern ACT and the data pattern are disposed. In an exemplary embodiment, the second insulation layer 120 may be provided by a spin coating process, a printing process, a sputtering process, a chemical vapor deposition process, an atomic layer deposition process, a plasma enhanced chemical vapor deposition process, a high density plasma-chemical vapor deposition process or a vacuum evaporation process in accordance with ingredients included in the second insulation layer 120, for example.

Figure 7A:
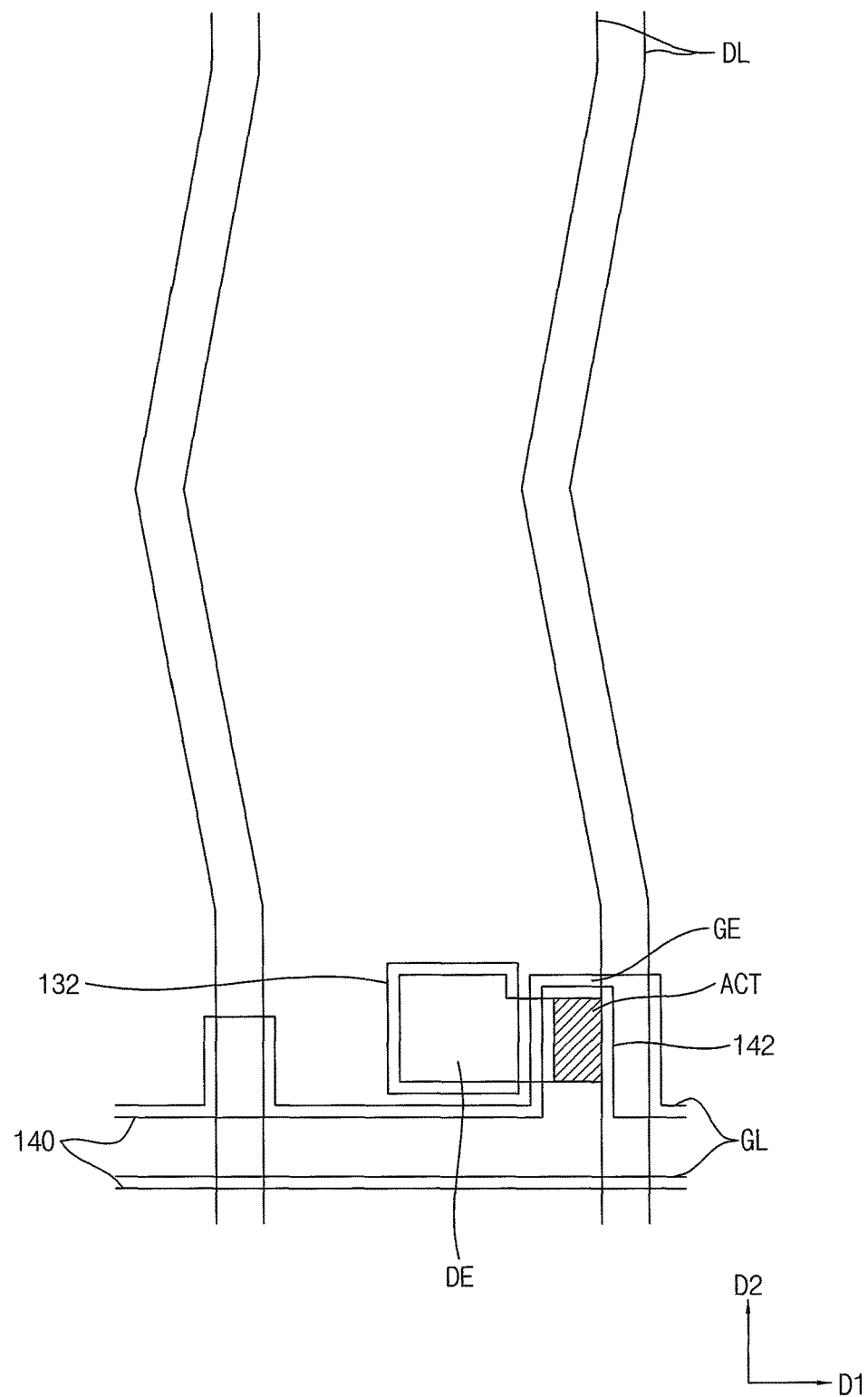
Figure 7B:
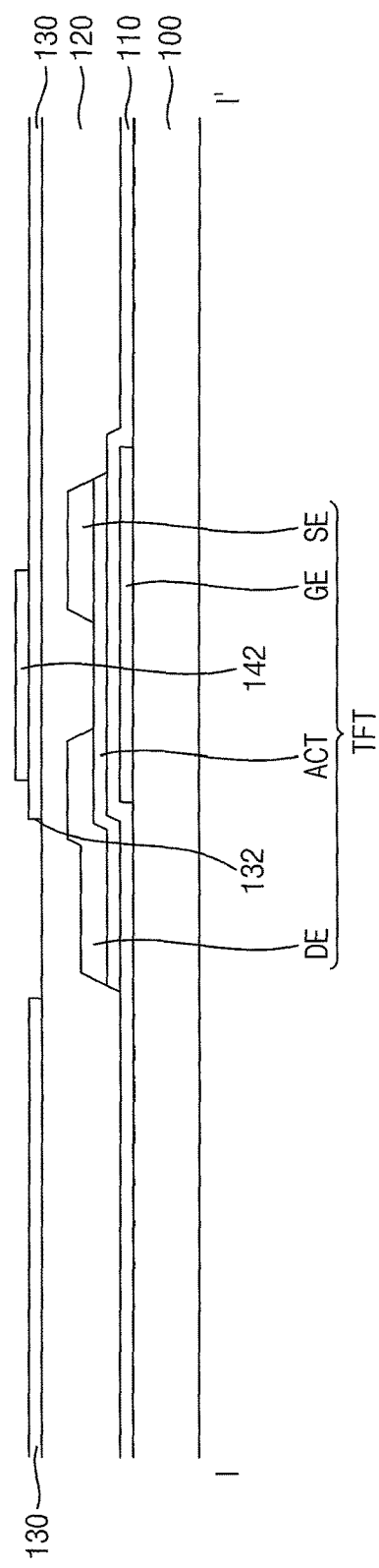

Referring to FIGS. 7A and 7B, a common electrode 130 in which a common electrode hole 132 is defined may be disposed on the second insulation layer 120. In an exemplary embodiment, a transparent conductive layer (not shown) may be disposed on the second insulation layer 120, and then a portion of the transparent conductive layer corresponding to the common electrode hole 132 may be removed to provide the common electrode 130.

Then, a metal pattern including an auxiliary common electrode line 140 and a cover electrode 142 may be disposed on the common electrode 130. In an exemplary embodiment, a metal layer (not shown) may be disposed on the common electrode 130, and then the metal layer may be partially etched by a photolithography process or an etching process using an additional mask. Hence, the metal pattern may be obtained. In an exemplary embodiment, the metal layer may be provided by a printing process, a sputtering process, a chemical vapor deposition process, an atomic layer deposition process, a vacuum evaporation process, a pulsed laser deposition process, and etc., for example.

Here, the cover electrode 142 may be provided in a same layer as the auxiliary common electrode line 140, so that an additional process for forming the cover electrode 142 is not desired.

Figure 8A:
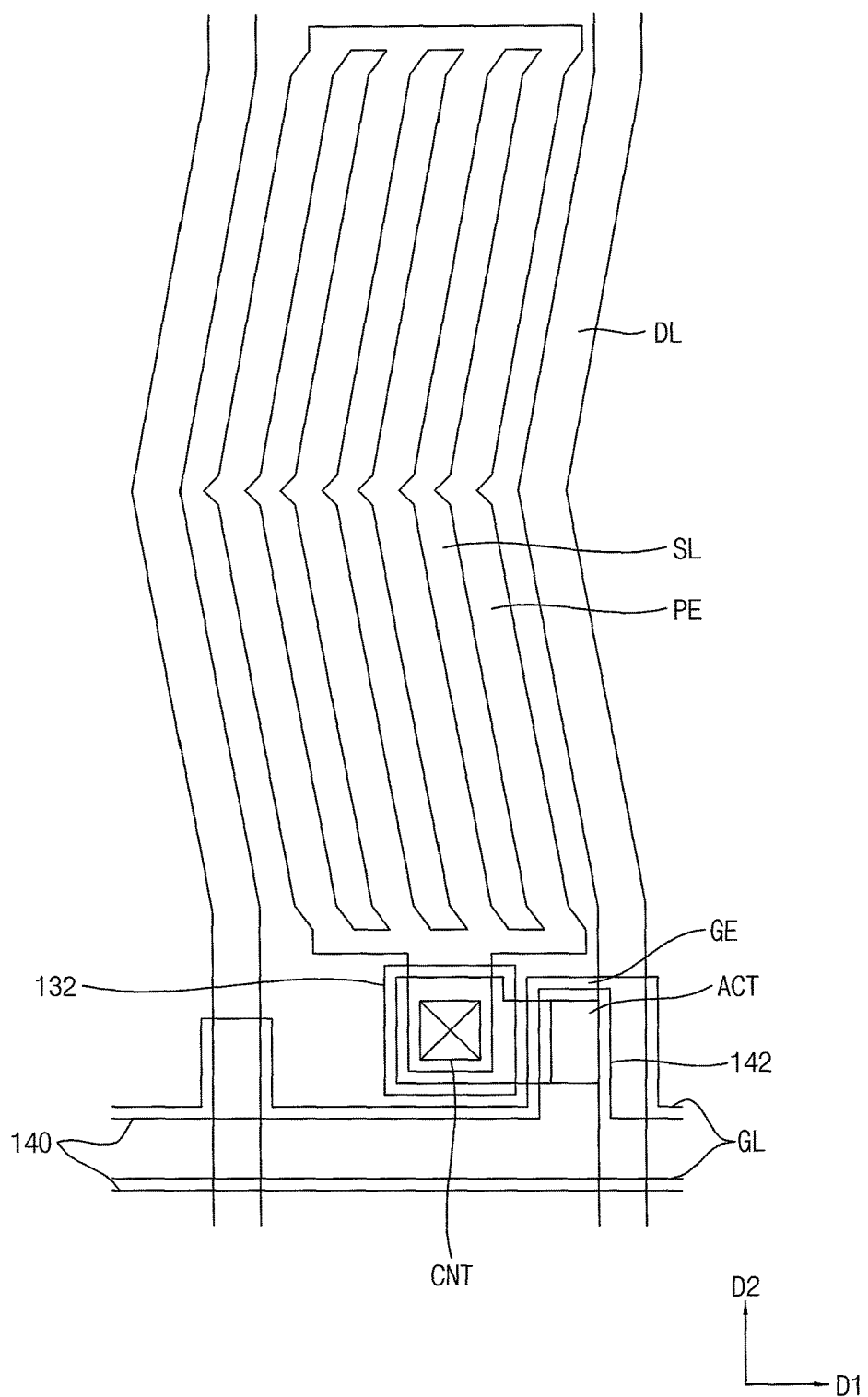
Figure 8B:
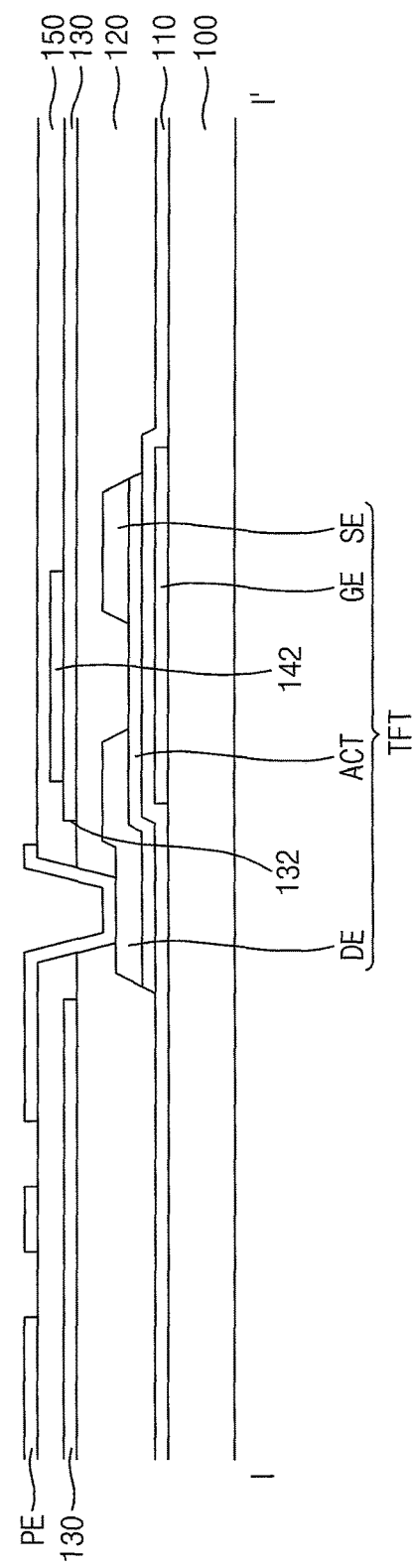

Referring to FIGS. 8A and 8B, a third insulation layer 150 may be disposed on the metal pattern, the common electrode 130 and the second insulation layer 120. In an exemplary embodiment, the third insulation layer 150 may be provided by a spin coating process, a chemical vapor deposition process, a plasma enhanced chemical vapor deposition process, a high density plasma-chemical vapor deposition process, and etc., for example.

Then, a contact hole CNT may be defined through the third insulation layer 150 and the second insulation layer 120. In the exemplary embodiment, the contact hole CNT is defined as a single hole through the second insulation layer 120 and the third insulation layer 150. However, in other exemplary embodiments, a first contact hole may be defined through the second insulation layer 120, and a second contact hole smaller than the first contact hole and overlapping the first contact hole may be defined through the third insulation layer 150.

Then, a pixel electrode PE may be disposed on the third insulation layer 150. In an exemplary embodiment, a transparent conductive layer (not shown) may be disposed on the third insulation layer 150, and then the transparent conductive layer may be partially etched by a photolithography process or an etching process using an additional mask, and the pixel electrode PE may be obtained. In an exemplary embodiment, the transparent conductive layer may be provided by a printing process, a sputtering process, a chemical vapor deposition process, an atomic layer deposition process, a vacuum evaporation process, a pulsed laser deposition process, and etc., for example. Accordingly, a TFT substrate may be provided.

Referring to FIGS. 1 and 2, after forming an opposite substrate, a liquid crystal layer LC may be disposed between the TFT substrate and the opposite substrate to manufacture the display apparatus.

The opposite substrate may be provided by forming a black matrix BM on a second base substrate 200, forming a color filter CF and forming an over-coating layer 210.

FIGS. 9A, 9B, 10A and 10B are plan views and cross-sectional views illustrating a method of manufacturing the display panel of FIG. 3. The method is substantially same as the method of FIGS. 5A to 8B, except for a forming order of an auxiliary common electrode line and a cover electrode. Thus, any further detailed descriptions concerning the same elements will be omitted.

Figure 9A:
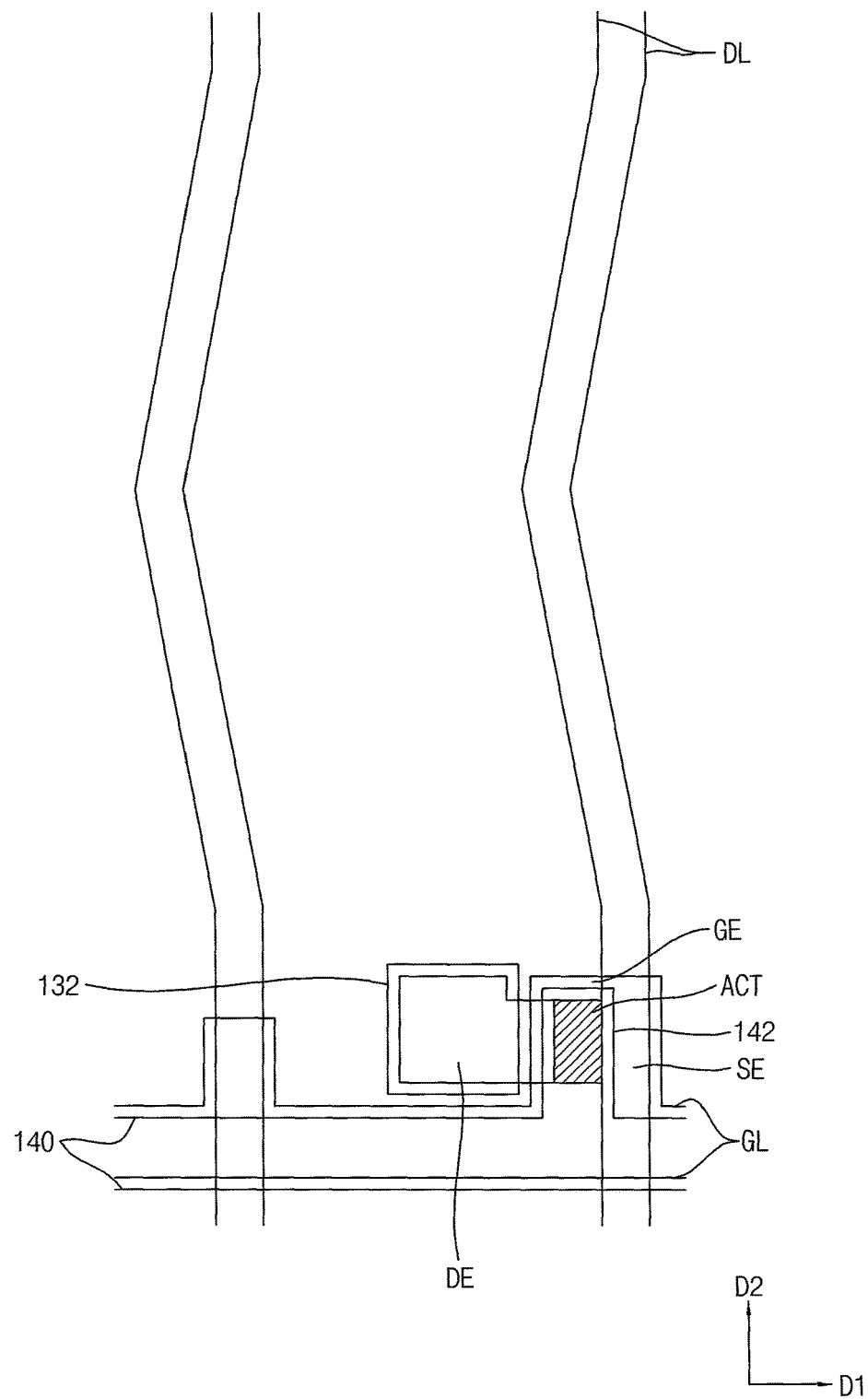
FIGS. 9A, 9B, 10A and 10B are plan views and cross-sectional views illustrating a method of manufacturing the display panel of FIG. 3.
Figure 9B:
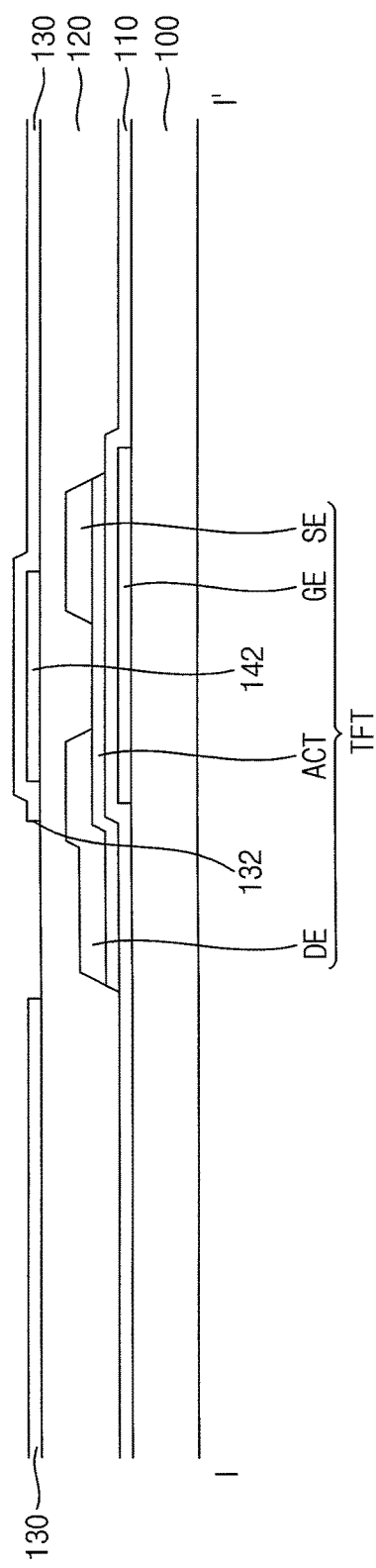

Referring to FIGS. 9A and 9B, a gate pattern may be provided on a first base substrate 100. The gate pattern may include a gate line GL and a gate electrode GE. Then, a first insulation layer 110 may be disposed on the first base substrate 100 on which the gate pattern is disposed. An active pattern ACT and a data pattern may be disposed on the first insulation layer 110. The data pattern may include a data line DL, a source electrode SE and a drain electrode DE. Then, a second insulation layer 120 may be disposed on the first insulation layer 110 on which the active pattern ACT and the data pattern are disposed.

A metal pattern including an auxiliary common electrode line 140 and a cover electrode 142 may be disposed on the second insulation layer 120. In an exemplary embodiment, a metal layer (not shown) may be disposed on the second insulation layer 120, and then the metal layer may be partially etched by a photolithography process or an etching process using an additional mask, and the metal pattern may be obtained.

Then, a common electrode 130 in which a common electrode hole 132 is defined may be disposed on the second insulation layer 120 on which the metal pattern is disposed. In an exemplary embodiment, a transparent conductive layer (not shown) may be disposed on the second insulation layer 120 on which the metal pattern is disposed, and then a portion of the transparent conductive layer corresponding to the common electrode hole 132 may be removed to provide the common electrode 130, for example.

Figure 10A:
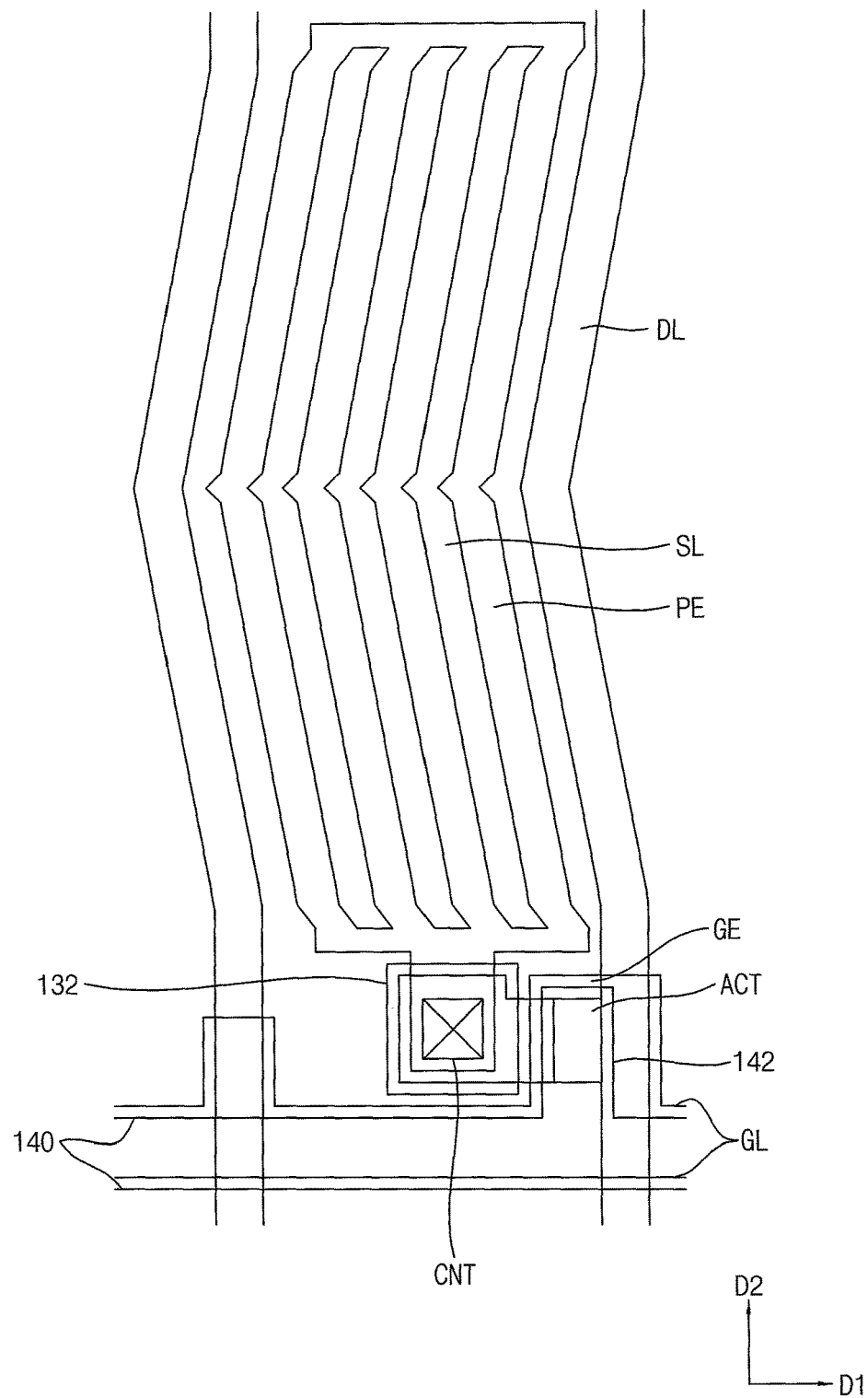
Figure 10B:
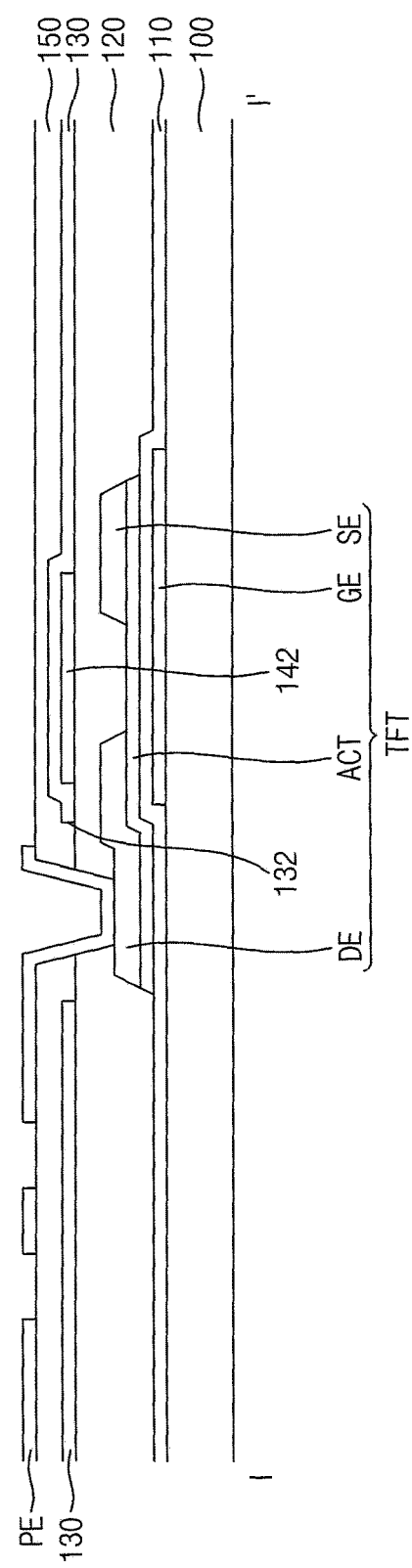

Referring to FIGS. 10A and 10B, a third insulation layer 150 may be disposed on the common electrode 130 and the second insulation layer 120. Then, a contact hole CNT may be defined through the third insulation layer 150 and the second insulation layer 120. Then, a pixel electrode PE may be disposed on the third insulation layer 150. Accordingly, a TFT substrate may be provided.

Referring to FIG. 3, after forming an opposite substrate, a liquid crystal layer LC may be disposed between the TFT substrate and the opposite substrate to manufacture the display apparatus.

The opposite substrate may be provided by forming a black matrix BM on a second base substrate 200, forming a color filter CF on the second base substrate 200 on which the black matrix BM is provided and forming an over-coating layer 210 on the color filter CF.

Figure 11:
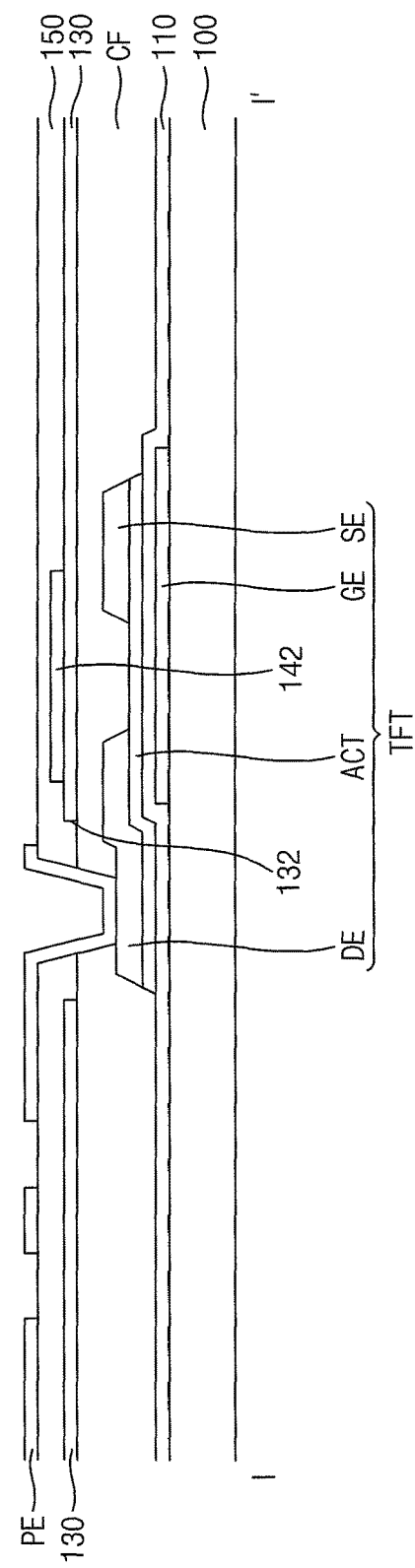
FIG. 11 is a cross-sectional view illustrating a method of manufacturing the display panel of FIG. 4.

FIG. 11 is a cross-sectional view illustrating a method of manufacturing the display panel of FIG. 4. The method is substantially same as the method of FIGS. 5A to 8B, except for a color filter. Thus, any further detailed descriptions concerning the same elements will be omitted.

Referring to FIG. 11, a gate pattern may be disposed on a first base substrate 100. The gate pattern may include a gate line GL (refer to FIG. 1) and a gate electrode GE. Then, a first insulation layer 110 may be disposed on the first base substrate 100 on which the gate pattern is disposed. An active pattern ACT and a data pattern may be disposed on the first insulation layer 110. The data pattern may include a data line DL, a source electrode SE and a drain electrode DE.

Then, a color filter CF may be disposed on the first insulation layer 110 on which the active pattern ACT and the data pattern are disposed. A common electrode 130 in which a common electrode hole 132 is defined may be disposed on the color filter CF. Then, a metal pattern including an auxiliary common electrode line 140 (refer to FIG. 1) and a cover electrode 142 may be disposed on the common electrode 130. A third insulation layer 150 may be disposed on the metal pattern and the color filter CF. Then, a contact hole CNT may be defined through the third insulation layer 150 and the color filter CF. Then, a pixel electrode PE may be disposed on the third insulation layer 150. Accordingly, a TFT substrate may be disposed.

Referring to FIG. 4, after forming an opposite substrate, a liquid crystal layer LC may be disposed between the TFT substrate and the opposite substrate to manufacture the display apparatus.

The opposite substrate may be provided by forming a black matrix BM on a second base substrate 200, and forming an over-coating layer 210 on the second base substrate 200 on which the black matrix BM is disposed.

According to the invention, a display panel includes a gate electrode, a thin film transistor including an active pattern having a channel area overlapping the gate electrode, a common electrode, an auxiliary common electrode line electrically connected to the common electrode and including an opaque metal, a pixel electrode electrically connected to the thin film transistor and overlapping the common electrode, and a cover electrode connected to the auxiliary common electrode line and overlapping the channel area. The cover electrode includes opaque metal, and covers the channel area, so that it is possible to prevent light from being reflected by an internal structure of the display panel and incident into the channel area. Accordingly, electrical characteristics of the thin film transistor may be prevented from being degraded, and display quality of a display apparatus including the display panel may be improved.

In addition, the cover electrode and the auxiliary common electrode line may be disposed in a same layer, so that an additional process for forming the cover electrode is not desired.

The foregoing is illustrative of the invention and is not to be construed as limiting thereof. Although a few exemplary embodiments of the invention have been described, those skilled in the art will readily appreciate that many modifications are possible in the exemplary embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of the invention and is not to be construed as limited to the specific exemplary embodiments disclosed, and that modifications to the disclosed exemplary embodiments, as well as other exemplary embodiments, are intended to be included within the scope of the appended claims. The invention is defined by the following claims, with equivalents of the claims to be included therein.

What is claimed is:

1. A display panel, comprising:
   a first base substrate;
   a gate line disposed on the first base substrate and extending in a first direction;
   a gate electrode electrically connected to the gate line;
   a thin film transistor comprising an active pattern which comprises a source area, a drain area and a channel area overlapping the gate electrode;
   a common electrode which is disposed on the first base substrate and to which a common voltage is applied;
   an auxiliary common electrode line electrically connected to the common electrode, and comprising an opaque metal;
   a pixel electrode electrically connected to the thin film transistor, disposed on the common electrode, and overlapping the common electrode; and
   a cover electrode connected to the auxiliary common electrode line, and overlapping the channel area.

2. The display panel of claim 1, wherein the common electrode comprises transparent conductive material, and
   the auxiliary common electrode line is disposed in a same layer as the auxiliary common electrode line, and comprises a same material as that of the auxiliary common electrode line.

3. The display panel of claim 2, wherein the auxiliary common electrode line extends in the first direction, and overlaps the gate line.

4. The display panel of claim 1, wherein an entirety of the channel area is covered by the cover electrode.

5. The display panel of claim 4, wherein the gate electrode is overlapped with an entirety of the cover electrode.

6. The display panel of claim 1, wherein the auxiliary common electrode line and the cover electrode directly contact the common electrode.

7. The display panel of claim 1, further comprises:
   a first insulation layer disposed between the gate electrode and the active pattern;
   a second insulation layer disposed between the active pattern and the common electrode; and
   a third insulation layer disposed between the common electrode and the pixel electrode.

8. The display panel of claim 7, wherein the auxiliary common electrode line and the cover electrode are disposed between the common electrode and the third insulation layer.

9. The display panel of claim 8, wherein the auxiliary common electrode line and the cover electrode are disposed between the common electrode and the second insulation layer.

10. The display panel of claim 8, wherein a common electrode hole is defined through the common electrode,
    in a plan view, a contact hole defined through the first and second insulation layers is defined in the common electrode hole, and
    the pixel electrode is connected to the thin film transistor through the contact hole.

11. The display panel of claim 10, wherein a plurality of slit-shaped openings is defined at the pixel electrode.

12. The display panel of claim 11, further comprising:
    a second base substrate facing the first base substrate; and
    a black matrix disposed on the second base substrate, overlapping the thin film transistor, the auxiliary common electrode line and the cover electrode.

13. The display panel of claim 11, further comprising a color filter disposed between the first base substrate and the common electrode.

14. The display panel of claim 11, wherein a common voltage is applied to the common electrode, the auxiliary common electrode line and the cover electrode.

* * * * *